United States Patent
Schäufele et al.

(10) Patent No.: US 8,624,466 B2
(45) Date of Patent: Jan. 7, 2014

(54) COMPONENT HAVING STRESS-REDUCED MOUNTING

(75) Inventors: Ansgar Schäufele, München (DE); Anton Leidl, Hohenbrunn (DE); Wolfgang Sauer, Taufkirchen (DE)

(73) Assignee: Epcos AG, Munich (DE)

( * ) Notice: Subject to any disclaimer, the term of this patent is extended or adjusted under 35 U.S.C. 154(b) by 383 days.

(21) Appl. No.: 12/665,385

(22) PCT Filed: Jun. 13, 2008

(86) PCT No.: PCT/EP2008/057498
§ 371 (c)(1),
(2), (4) Date: Mar. 11, 2010

(87) PCT Pub. No.: WO2008/155296
PCT Pub. Date: Dec. 24, 2008

(65) Prior Publication Data
US 2010/0176899 A1    Jul. 15, 2010

(30) Foreign Application Priority Data

Jun. 20, 2007 (DE) .......... 10 2007 028 292

(51) Int. Cl.
*H01L 41/08* (2006.01)

(52) U.S. Cl.
USPC ............. 310/324; 310/320; 310/365

(58) Field of Classification Search
USPC ......... 310/320, 324, 345, 351, 355, 311, 366, 310/363, 365; 333/133, 189, 188, 191
IPC .................. H03H 9/25; H01L 41/08
See application file for complete search history.

(56) References Cited

U.S. PATENT DOCUMENTS

| | | | |
|---|---|---|---|
| 6,366,186 B1 * | 4/2002 | Hill et al. | 335/78 |
| 2003/0076664 A1 | 4/2003 | Menschig et al. | |
| 2004/0029356 A1 * | 2/2004 | Timme et al. | 438/455 |
| 2005/0128027 A1 * | 6/2005 | Song et al. | 333/133 |

FOREIGN PATENT DOCUMENTS

| | | | | |
|---|---|---|---|---|
| EP | 1191559 | * | 3/2002 | H01H 50/00 |
| EP | 1191559 A2 | * | 3/2002 | |
| EP | 0834989 B1 | | 9/2003 | |

* cited by examiner

*Primary Examiner* — Thomas Dougherty
*Assistant Examiner* — Karen B Addison
(74) *Attorney, Agent, or Firm* — Nixon Peabody LLP

(57) ABSTRACT

A component (1) is proposed wherein the suspension of the component (1) is effected in a stress-reduced manner. The component (1) can rest on a membrane (4) or be held by a spring element (2). The membrane (4) or the spring element (2) is situated above a depression (6) or an opening (7) partially spanned by the membrane (4). Preferably, the membrane (4) has a modulus of elasticity that is less than or equal to the modulus of elasticity of the component (1) or of the substrate (3). The component (1) can be covered with metal electrodes (10) wholly or partially over the area on two sides.

22 Claims, 4 Drawing Sheets

COMPONENT HAVING STRESS-REDUCED MOUNTING

CROSS-REFERENCE TO RELATED APPLICATIONS

This application is a U.S. National Stage of International Application No. PCT/EP2008/057498, filed Jun. 13, 2008, which claims the benefit of Germany Patent Application No. 10 2007 028 292.5, filed on Jun. 20, 2007, both of which are incorporated herein by reference in their entireties.

FIELD OF THE INVENTION

A description is given of a fixture for electrical components, for example bridge-type BAW resonators, which enables the components to be fixed in mechanically stress-reduced fashion.

BACKGROUND OF THE INVENTION

The document US 2005/0128027 A1 discloses a thin-film FBAR resonator.

SUMMARY OF THE INVENTION

One object to be achieved consists in specifying a component fixture which enables a component, for example a piezo-element, to be fixed to a substrate without mechanical stresses.

The component is applied at the top on a substrate by means of an elastic suspension, such that the component can move relative to the substrate. The suspension preferably comprises an elastic element. Preferably, the modulus of elasticity of the elastic element is lower than the modulus of elasticity of the component or of the substrate.

The suspension is suitable for stress-sensitive components, in particular MEMS components. Furthermore, the suspension is suitable for a component having micromechanical structures which are sensitive to mechanical stresses in the suspension. The component is preferably a bridge-type BAW resonator.

Preferably, the elastic element is embodied as a membrane which is stretched over the substrate and with which the component is suspended above the substrate.

In order to connect the component to a substrate without laterally clamping it in, which can lead to mechanical strains, a soft frame can be fitted around the component, which frame can absorb strains. The substrate and the component are thus mechanically decoupled from one another.

The frame preferably has a significantly lower modulus of elasticity (Young's modulus) E and thus a lower stiffness than the materials used in the component. This lower stiffness can be achieved by means of a soft polymer or by means of a very thin and possibly structured metal layer. By way of example, BCB (benzocyclobutene) with preferably E=10 GPa or parylene with preferably E=0.07 GPa can be used as polymers. By contrast, the materials used in the component have values of the modulus of elasticity for example in the range of E=75 GPa (passivation layer: $SiO_2$), E=107 GPa (substrate: Si) to E=310 GPa (piezo-layer: AlN).

In a further embodiment variant, a spring element is used for suspending the component above the substrate. Said spring element is preferably arranged between substrate and component. In one preferred variant, a leaf spring is involved in this case.

The connections between component and substrate by means of a frame have a strength which suffices for fixing the component above the substrate. The component can rest on the substrate, or be separated by an air gap. At the same time, the connection is soft enough to compensate for mechanical stresses.

Mechanical stresses can arise for example during the production process or in subsequent operation as a result of temperature changes.

The substrate preferably has a depression below the component, said depression being spanned by the membrane.

In a further embodiment, the depression reaches through the entire substrate. The substrate then has an opening spanned by the membrane.

The edge of the component is preferably situated above the margin of the substrate. However, the edges can also be situated completely above the depression.

In one embodiment variant, the suspension of the component is effected at the side edges thereof. In a further variant, the component rests with a lower marginal region on the membrane. In a further variant, the suspension of the component can be effected by means of marginal regions of the component at the underside of the membrane. The membrane can also cover larger regions of the component or the entire surface of the component.

The component has metal electrodes on a first and a second side, which metal electrodes can be drawn back in regions of the suspension in order to decouple the acoustically active region from the suspension.

The soft membrane can absorb the strains that are caused by production and/or arise as a result of different temperature coefficients of expansion.

A static pressure can build up in the depression in the substrate in a manner governed by temperature. In one variant, therefore, a pressure equalizing opening is provided in the membrane, through which the pressure can escape toward the outside.

The drawings described below in the context of exemplary embodiments should not be interpreted as true to scale. Rather, for the sake of improved illustration, individual dimensions may be illustrated in enlarged fashion, in reduced fashion or in distorted fashion.

Elements which are identical to one another or which perform the same function are designated by the same reference symbols. In a manner representative of other possible components, possible suspension variants are described only for a resonator operating with bulk acoustic waves, but can be transferred to other types of components in a simple manner.

DETAILED DESCRIPTION OF THE INVENTION

Figure 1:
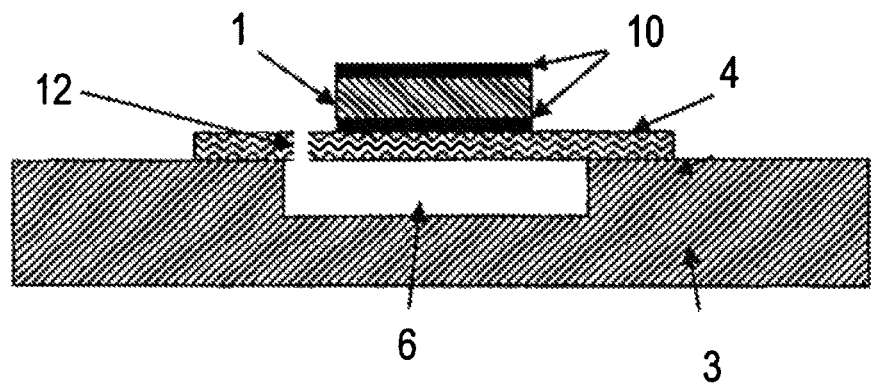
FIG. 1 shows a first embodiment, wherein the substrate has a depression below the resonator.

FIG. 1 illustrates a first exemplary embodiment, wherein the component 1 is suspended by means of a membrane 4. A depression 6 is situated in the substrate 3 below the membrane 4, said depression decoupling the component 1 from the substrate. The component 1 rests on the membrane 4. Preferably, a pressure equalizing opening 12 is situated in the membrane 4. Said pressure equalizing opening 12 serves for equalizing the static pressure that can form in the depression 6 during operation as a result of temperature changes. The component, embodied here as a resonator operating with bulk acoustic waves, comprises a piezoelectric layer having metal electrodes 10 on two sides. The membrane has a lower stiffness than the component and is formed from a polymer, in particular.

The elastic membrane ensures that no lateral strain of the resonator with the substrate can occur. The elastic and compliant membrane can absorb forces that have occurred in the case of different thermal expansions or in the case of strains that have occurred in the production process, such that the resonator or the MEMS component is suspended in a strain-free state.

Figure 2:
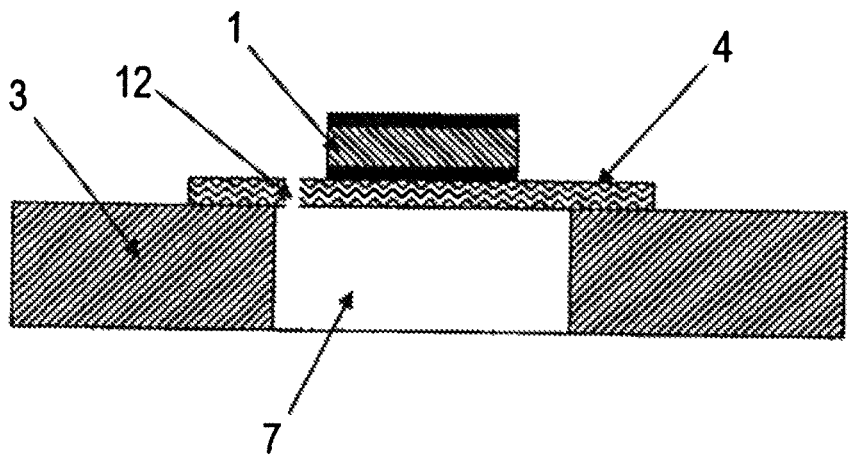
FIG. 2 shows a second embodiment, wherein an opening is situated in the substrate below the resonator.

FIG. 2 illustrates a further exemplary embodiment, wherein an opening 7 is situated in the substrate 3 below the component 1. Said opening 7 is spanned by a membrane 4. Situated in the membrane 4 is a pressure equalizing opening 12, which can also be dispensed with, however, owing to the opening 7 of the substrate 3 being open "at the bottom".

Figure 3A:
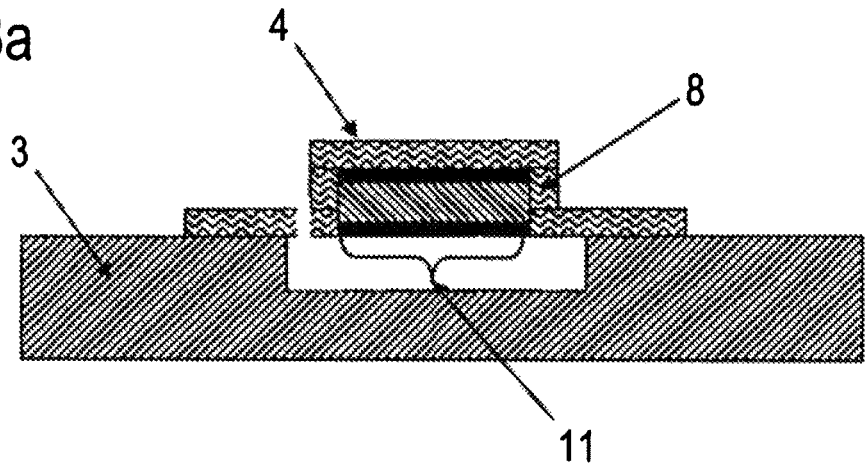
FIGS. 3a-3c show different variants of the suspension of the resonator with the aid of a membrane.

FIG. 3a illustrates a further variant of the fixture of the component 1 above a depression 6. In this exemplary embodiment, the membrane 4 is stretched over the component, such that the component 1 has a free region 11 on the side which is remote from the membrane 4 but faces the substrate 3, said free region preferably comprising the entire underside of the component 1. The membrane 4 preferably bears against the side edges 8 of the component 1.

Figure 3B:
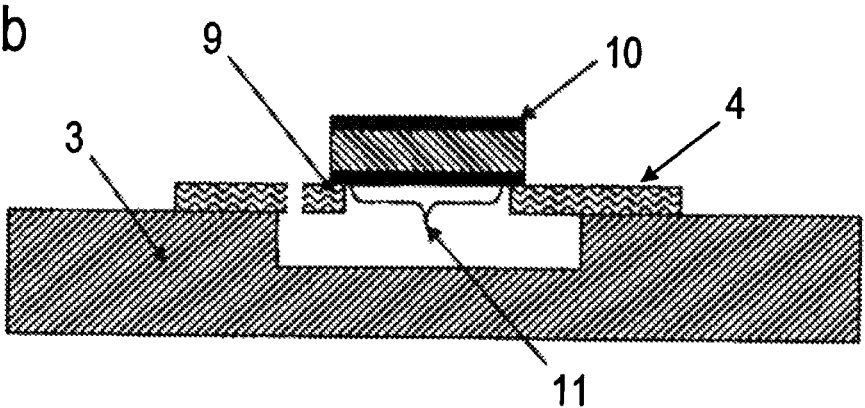

FIG. 3b illustrates a further exemplary embodiment, wherein the component 1 rests only with a marginal region 9 on the membrane 4 above the depression 6 in the substrate 3. As a result, the component 1 can have on the underside a region 11 free of the membrane 4, said region corresponding to a cutout in the membrane 4.

Figure 3C:
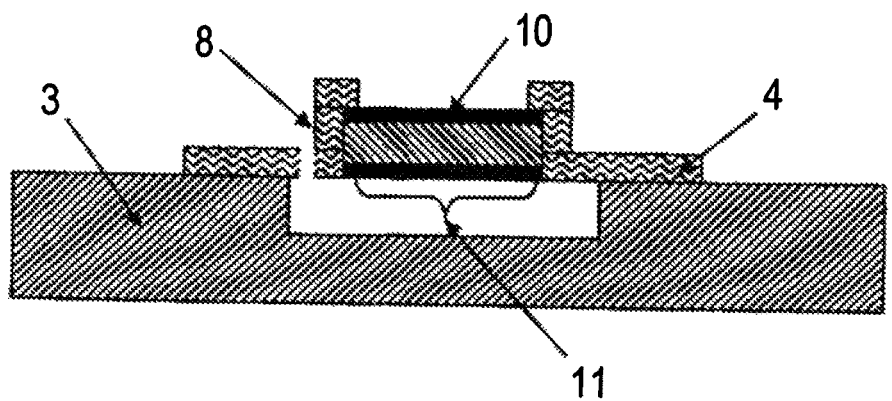

A further exemplary embodiment is shown in FIG. 3c. Here the component 1 is held by the membrane 4 at the side edges 8 of the component 1. In this fixture variant, the component 1 can have both on the underside and on the top side a region 11 free of the membrane 4.

Figure 4A:
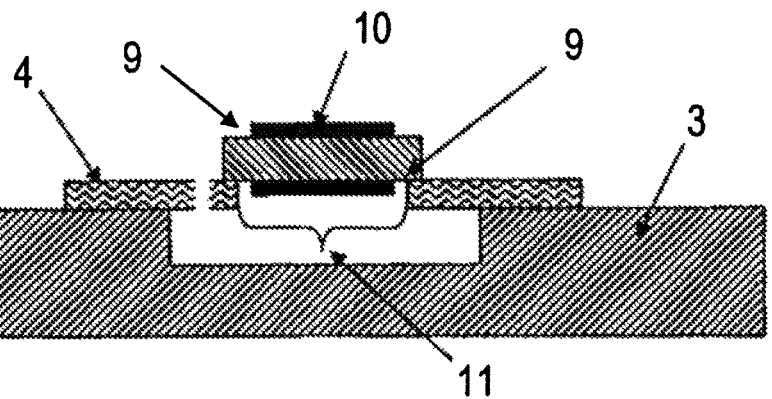
FIGS. 4a-4d show different variants of the suspension of the resonator with partially drawn-back regions of the metal electrodes.

The variants 4a to 4d show exemplary embodiments in which the metal electrodes 10 on the component 1 are drawn back in marginal regions 9 in order that the acoustically active regions are decoupled from the membrane. FIG. 4a, the component 1 rests only with a marginal region 9 on the membrane 4 and in this case covers a cutout provided in the membrane 4, such that a free region 11 can occur on the underside of the component 1. The metal electrodes 10 are drawn back on both sides here, such that the component 1 can have regions free of metal electrodes 10 on the top side and underside.

Figure 4B:
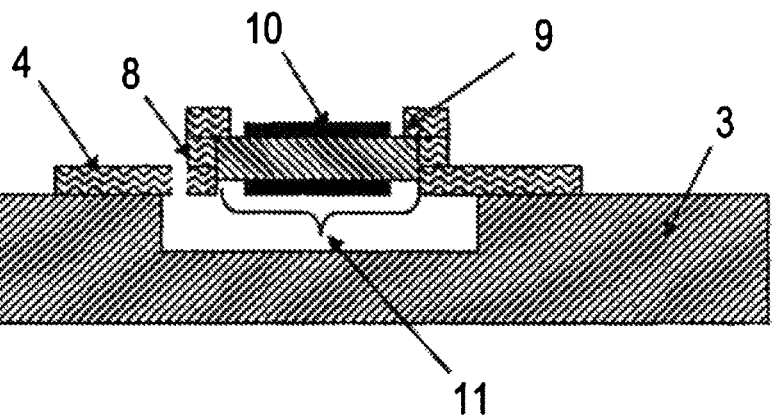

In FIG. 4b, the fixture of the component 1 is effected by means of the side edges 8 of the component 1. The membrane 4 can cover a narrow marginal region 9 of the component 1 on the top side of the component 1. The regions with metal electrodes 10 are drawn back from the component edge on both sides and are not in contact with the membrane 4.

Figure 4C:
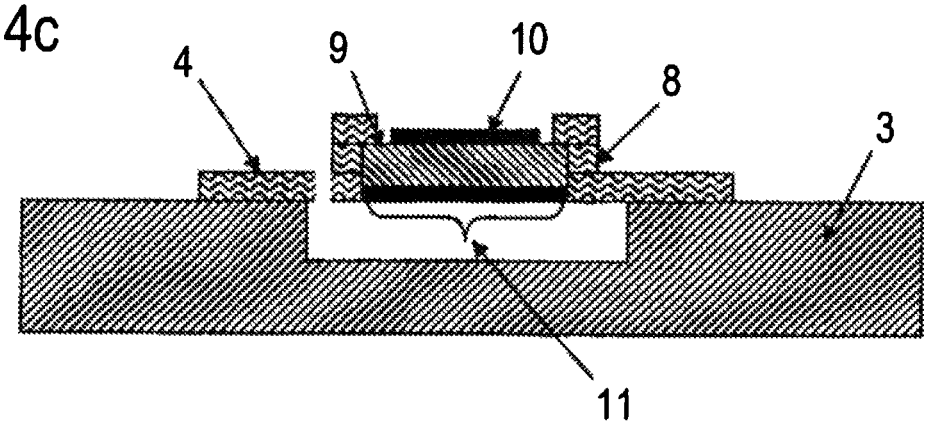

In FIG. 4c, the metal electrodes 10 are drawn back only on the top side of the component 1. The underside of the component 1 is covered with a metal electrode 10 over the area. The fixture of the component 1 is effected by means of the side edges 8 thereof. The membrane 4 can cover a narrow marginal region of the top side of the component 1, but is preferably not in contact with the metal electrodes 10 on the top side, such that the membrane 4 does not cause any vibration damping of the component 1 embodied as a resonator.

Figure 4D:
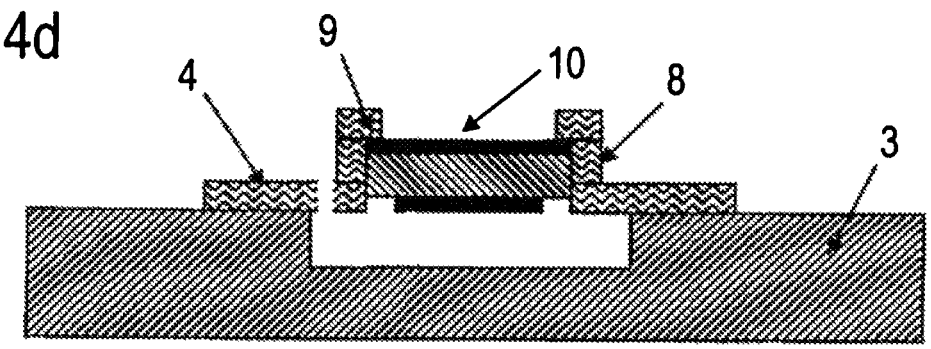

FIG. 4d shows an embodiment variant in which the metal electrodes 10 are drawn back only on the underside of the component 1 and are thereby decoupled from the fixture. The fixture is effected by means of the side edges 8 of the component 1. The membrane 4 can cover a narrow marginal region 9 on the top side of the component 1 and therefore also a narrow marginal region of the upper metal electrodes 10. Since this marginal region, owing to the metal electrodes 10 drawn back at the bottom, does not belong to the active region of the resonator, no damping of resonator vibrations occurs here either.

Figure 5:
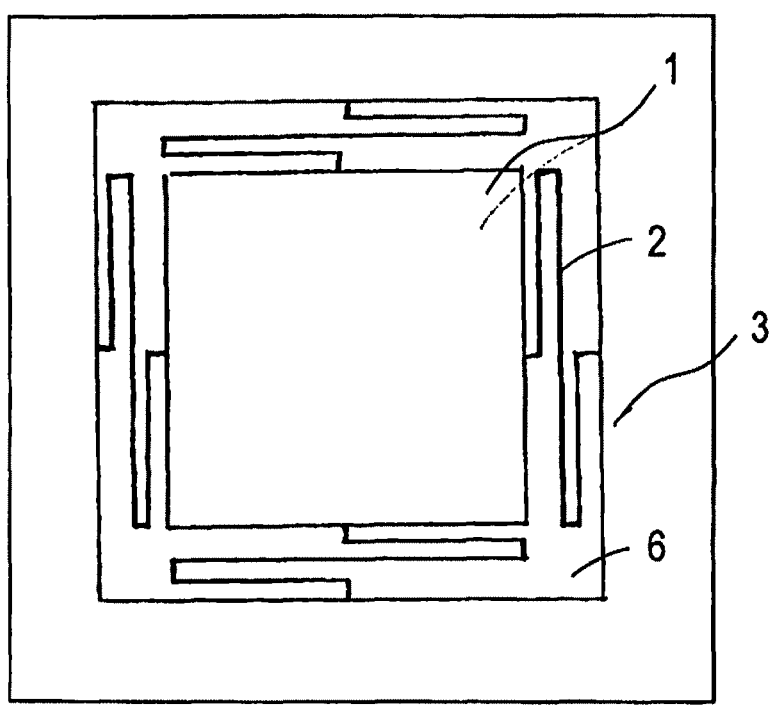
FIG. 5 shows a further embodiment, wherein the suspension of the resonator at the substrate is effected by means of a spring.

FIG. 5 shows a variant of the fixture of the component 1 to the substrate 3 in which the suspension is effected by means of a spring element 2. The component 1 is fixed above a depression 6 with the aid of the spring element 2.

Although only a restricted number of possible developments of the invention could be described in the exemplary embodiments, the invention is not restricted to them. It is possible, in principle, for the membrane also to cover other regions of the component, or for the fixture of the component to be effected not just by means of the side edges or marginal regions. It is also conceivable for a plurality of depressions to be situated below the component or for a plurality of components to be arranged on a substrate and to be fixed above a common or a plurality of separate depressions by means of a membrane or some other suspension. The component is not restricted to the number of schematically illustrated elements.

Rather, the features of the individual embodiments can be combined with one another in any desired manner—in so far as is technically practical.

What is claimed is:

1. A component having stress-reduced fixture, comprising:
a piezoelectric layer having metal electrodes,
wherein the component is applied at the top of a substrate by an elastic suspension and has a modulus of elasticity,
wherein the suspension comprises an elastic element,
wherein the elastic element has a modulus of elasticity that is lower than the modulus of elasticity of the component and lower than a modulus of elasticity of the substrate,
wherein the elastic element is a membrane,
wherein the substrate has a depression or an opening below the component, and
wherein the membrane has a pressure equalizing opening in the region above the depression or opening.

2. The component as claimed in claim 1, wherein the component is an element of a bridge-type BAW resonator.

3. The component as claimed in claim 2, wherein the substrate has an opening below the component.

4. The component as claimed in claim 2, wherein the membrane spans the opening.

5. The component as claimed in claim 1, wherein the elastic element has a lower stiffness than the component.

6. The component as claimed in claim 1, wherein the elastic element is a spring element.

7. The component as claimed in claim 1, wherein the membrane consists of a polymer.

8. The component as claimed in claim 1, wherein the membrane consists of benzocyclobutene (BCB) or parylene.

9. The component as claimed in claim 1, wherein the membrane is embodied as a thin metal layer.

10. The component as claimed in claim 1, wherein the membrane spans the depression.

11. The component as claimed in claim 1, wherein the edge of the component is situated above the margin of the substrate.

12. The component as claimed in claim 11, wherein the component rests with a marginal region on the membrane.

13. The component as claimed in claim 1, wherein the suspension of the component is effected at the side edges.

14. The component as claimed in claim 13, wherein the suspension of the component is effected at a marginal region by means of the underside of the membrane.

15. The component as claimed in claim 13, wherein the suspension of the component is effected by means of the underside of the membrane.

16. The component as claimed in claim 1, wherein metal electrodes are situated on a first side of the component.

17. The component as claimed in claim 1, wherein metal electrodes are situated on a second side of the component.

18. The component as claimed in claim 1, wherein the component is free of metal electrodes in the regions which are in contact with the suspension.

19. A component having stress-reduced fixture, comprising:
   a piezoelectric layer having metal electrodes,
   wherein the component is applied at the top of a substrate by an elastic suspension,
   wherein the suspension comprises an elastic element,
   wherein the elastic element has a modulus of elasticity that is lower than the modulus of elasticity of the component and of the substrate, and
   wherein the component is free of metal electrodes in the regions which are in contact with any part of the suspension.

20. A bridge-type BAW resonator having stress-reduced fixture, comprising:
   a component having a plurality of layers each composed of a different material, wherein the component includes a piezoelectric layer having metal electrodes;
   a substrate; and
   an elastic suspension that comprises an elastic element, the component being applied at the top of the substrate by the elastic element,
   wherein the elastic element has a modulus of elasticity that is lower than the modulus of elasticity of the component and of the substrate, and wherein the elastic element is a spring element.

21. The bridge-type BAW resonator of claim 20, wherein the substrate has an opening below the component and the opening of the substrate is open at the side facing away from the component.

22. A bridge-type BAW resonator having stress-reduced fixture, comprising:
   a component having a plurality of layers each composed of a different material, wherein the component includes a piezoelectric layer having metal electrodes;
   a substrate; and
   an elastic suspension including a membrane, the component being applied at the top of the substrate by the membrane, wherein the membrane has a modulus of elasticity that is lower than the modulus of elasticity of the component and of the substrate, and
   (a) wherein the membrane is stretched over the component such that the component has a region free of the membrane on a side that is remote from the membrane and that faces the substrate, or
   (b) wherein the component rests only with a marginal region on the membrane such that the component has a region free of the membrane on its underside facing the substrate, or
   (c) wherein the component is held by the membrane at side edges of the component such that the component has a region free of the membrane both on its underside facing the substrate and on its top side facing away from the substrate.

* * * * *